(12) United States Patent
Ke et al.

(10) Patent No.: US 11,682,826 B2
(45) Date of Patent: Jun. 20, 2023

(54) ELECTRONIC PACKAGE AND FABRICATION METHOD THEREOF

(71) Applicant: SILICONWARE PRECISION INDUSTRIES CO., LTD., Taichung (TW)

(72) Inventors: Chung-Yu Ke, Taichung (TW); Chia-Chu Lai, Taichung (TW); Liang-Pin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 302 days.

(21) Appl. No.: 17/231,436

(22) Filed: Apr. 15, 2021

(65) Prior Publication Data
US 2022/0263221 A1  Aug. 18, 2022

(30) Foreign Application Priority Data

Feb. 18, 2021 (TW) .................. 110105520

(51) Int. Cl.
*H01Q 1/22* (2006.01)
*H01Q 1/40* (2006.01)
(Continued)

(52) U.S. Cl.
CPC ....... *H01Q 1/2283* (2013.01); *H01L 21/4853* (2013.01); *H01L 21/4857* (2013.01);
(Continued)

(58) Field of Classification Search
CPC ........ H01Q 1/2283; H01Q 1/246; H01Q 1/38; H01Q 1/40; H01Q 9/0414; H01Q 21/28; H01L 21/4853; H01L 21/4857; H01L 21/565; H01L 21/568; H01L 21/6835; H01L 21/49816; H01L 21/49833; H01L 23/3128; H01L 23/5383; H01L 23/5386; H01L 23/5389; H01L 23/66; H01L 24/19; H01L 24/20; H01L 2223/6677; H01L 24/13; H01L 24/16; H01L 24/32; H01L 24/73; H01L 24/92; H01L 2221/68345; H01L 2221/68359; H01L 2221/68372; H01L 2224/0401; H01L 2224/04105;
(Continued)

(56) References Cited

U.S. PATENT DOCUMENTS

2010/0309078 A1* 12/2010 Rofougaran ........... H01Q 13/20
343/772
2010/0311369 A1* 12/2010 Rofougaran ....... G06K 7/10316
455/129
(Continued)

FOREIGN PATENT DOCUMENTS

CN  115036669 A  *  9/2022

*Primary Examiner* — Seokjin Kim
(74) *Attorney, Agent, or Firm* — Kelly & Kelley, LLP

(57) ABSTRACT

An electronic package is provided and includes a first carrier structure having a plurality of antenna feed lines, and an antenna module disposed on the first carrier structure. The antenna module includes a substrate body having a plurality of recesses with different depths. Further, antenna layers are formed in the plurality of recesses and electromagnetically coupled to the antenna feed lines so as to improve the overall radiation efficiency of the antenna assembly.

17 Claims, 8 Drawing Sheets

(51) Int. Cl.
*H01L 23/31* (2006.01)
*H01L 23/538* (2006.01)
*H01L 23/66* (2006.01)
*H01L 23/00* (2006.01)
*H01L 21/48* (2006.01)
*H01L 21/56* (2006.01)
*H01L 21/683* (2006.01)
*H01Q 1/24* (2006.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/19* (2013.01); *H01L 24/20* (2013.01); *H01Q 1/246* (2013.01); *H01Q 1/40* (2013.01); *H01L 2221/68372* (2013.01); *H01L 2223/6677* (2013.01); *H01L 2224/214* (2013.01)

(58) Field of Classification Search
CPC ..... H01L 2224/12105; H01L 2224/131; H01L 2224/16227; H01L 2224/214; H01L 2224/32225; H01L 2224/48227; H01L 2224/73204; H01L 2224/73267; H01L 2224/92125; H01L 2224/92244; H01L 2224/97; H01L 2225/1023; H01L 2225/1035; H01L 2225/1041; H01L 2225/1058; H01L 2924/15311; H01L 2924/15331

See application file for complete search history.

(56) References Cited

U.S. PATENT DOCUMENTS

| | | | |
|---|---|---|---|
| 2020/0127366 A1* | 4/2020 | Liao | H01L 23/66 |
| 2020/0303806 A1* | 9/2020 | Wu | H01L 23/552 |
| 2020/0328166 A1* | 10/2020 | Tsai | H01Q 1/243 |
| 2021/0083389 A1* | 3/2021 | Tung | H01Q 9/0414 |
| 2021/0175629 A1* | 6/2021 | Kang | H01Q 9/0414 |
| 2022/0336385 A1* | 10/2022 | Wang | H01L 23/49827 |
| 2023/0039444 A1* | 2/2023 | Wu | H01L 23/49816 |

* cited by examiner

ELECTRONIC PACKAGE AND FABRICATION METHOD THEREOF

BACKGROUND

1. Technical Field

The present disclosure relates to electronic packages, and more particularly, to an electronic package having an antenna structure and a fabrication method thereof.

2. Description of Related Art

Currently, wireless communication technologies have been widely applied in a variety of consumer electronic products such as mobile phones and tablet computers to facilitate receiving or transmitting of various wireless signals. To facilitate portability of the consumer electronic products and easy access to Internet (e.g., viewing multimedia contents), wireless communication modules are becoming lighter, thinner, shorter and smaller. Therein, patch antennas have been widely applied in wireless communication modules of electronic products due to their advantages of small size, light weight and easy fabrication.

In addition, along with the improvement of image quality of multimedia contents, more and more multimedia data is produced. Accordingly, wireless transmission bandwidth needs to be increased. Therefore, the fifth generation (5G) wireless transmission technologies have been developed, which use higher transmission frequencies and hence have a stricter requirement on related wireless communication modules.

5G applications tend to be completely commercialized in the future. The 5G applications use a high frequency band from 1 GHz to 1000 GHz and a commercial application mode of 5G in combination with 4G LTE, and a cellular base station is set up outdoors to cooperate with a small base station set indoors. Therefore, 5G mobile communication will use a large number of antennas in a base station so as to meet large capacity, fast transmission and low delay of a 5G system.

FIG. 1 is a schematic perspective view of a conventional wireless communication module 1. Referring to FIG. 1, the wireless communication module 1 has: a substrate 10, a plurality of electronic elements 11 disposed on and electrically connected to the substrate 10, an antenna structure 12 formed on the substrate 10, and an encapsulant 13 formed on the substrate 10. The substrate 10 is a circuit board and has a rectangular shape. The antenna structure 12 is of a planar type and has an antenna body 120 and a conductive wire 121 electrically connecting the antenna body 120 and the electronic elements 11. The encapsulant 13 covers the electronic elements 11 and a portion of the conductive wire 121.

Taking a smartphone as an example, the 5G frequency band can be divided into 3.5 GHz to 6 GHz, 28 GHz, 39 GHz, 60 GHz, 71 GHz to 73 GHz, etc. Further, the 5G system needs more antenna configurations to improve signal quality and transmission speed.

However, in the conventional wireless communication module 1, since the antenna structure 12 is of a planar type and the length and width of the substrate 10 are fixed, the wiring space (the number of layers) of the circuit is limited. Therefore, the functions of the antenna structure 12 are limited. As such, the wireless communication module 1 cannot provide electrical functions required for operating the 5G system, imposing a difficulty in meeting the requirement of antenna operation of the 5G system.

Further, if the layout area on the surface of the substrate 10 is increased for forming the antenna body 120 with multiple frequencies, the width of the substrate 10 will be increased. Consequently, it is difficult to reduce the width of the wireless communication module 1, thus hindering miniaturization of the wireless communication module 1.

Therefore, how to overcome the above-described drawbacks of the prior art has become an urgent issue in the art.

SUMMARY

In view of the above-described drawbacks, the present disclosure provides an electronic package, which comprises: a first carrier structure having a plurality of antenna feed lines; and an antenna module disposed on the first carrier structure and comprising a substrate body having opposite first and second surfaces, the substrate body being disposed on the first carrier structure via the first surface thereof, wherein the first surface of the substrate body has a plurality of recesses with different depths and first antenna layers are formed in the plurality of recesses, and the second surface of the substrate body has second antenna layers corresponding in configuration to the first antenna layers, and wherein the first antenna layers are electromagnetically coupled to the antenna feed lines and the second antenna layers.

In an embodiment, the electronic package further comprises an air gap formed between the first antenna layers and the antenna feed lines.

In an embodiment, the antenna module is disposed on the first carrier structure through support members.

In an embodiment, the first carrier structure has two opposite sides, and the antenna module is disposed on one of the sides of the first carrier structure, and wherein the electronic package further comprises: a second carrier structure stacked on the other side of the first carrier structure through a plurality of conductors; and at least one electronic element disposed between the first carrier structure and the second carrier structure and electrically connected to the conductors.

In an embodiment, the first carrier structure is electrically connected to the second carrier structure through the conductors.

In an embodiment, the antenna feed lines are electrically connected to the conductors to electrically conduct the electronic element.

In an embodiment, the electronic package further comprises an encapsulant formed between the first carrier structure and the second carrier structure and encapsulating the electronic element.

In an embodiment, the electronic package further comprises a plurality of conductive elements formed on the second carrier structure, wherein the conductive elements and the conductors are positioned at different sides of the second carrier structure.

The present disclosure further provides a method for fabricating an electronic package, which comprises: providing a substrate body having a first surface and a second surface opposite to the first surface, wherein the second surface has second antenna layers thereon; forming a plurality of recesses with different depths on the first surface of the substrate body; forming first antenna layers in the plurality of recesses, wherein the first antenna layers are electromagnetically coupled to the second antenna layers; and disposing the substrate body on a first carrier structure having a plurality of antenna feed lines via the first surface thereof, wherein the first antenna layers are electromagnetically coupled to the antenna feed lines.

In an embodiment, the method further comprises forming an air gap between the first antenna layers and the antenna feed lines.

In an embodiment, the substrate body is disposed on the first carrier structure through support members.

In an embodiment, the plurality of recesses are formed on the first surface of the substrate body by etching.

In an embodiment, the first carrier structure has two opposite sides, and the substrate body is disposed on one of the sides of the first carrier structure, and the method of the present disclosure further comprises: stacking a second carrier structure on the other side of the first carrier structure through a plurality of conductors; and disposing at least one electronic element between the first carrier structure and the second carrier structure to electrically connect the conductors.

In an embodiment, the first carrier structure is electrically connected to the second carrier structure through the conductors.

In an embodiment, the antenna feed lines are electrically connected to the conductors to electrically conduct the electronic element.

In an embodiment, the method further comprises forming an encapsulant between the first carrier structure and the second carrier structure for encapsulating the electronic element.

In an embodiment, the method further comprises disposing a plurality of conductive elements on the second carrier structure, wherein the conductive elements and the conductors are positioned at different sides of the second carrier structure.

According to the present disclosure, the recesses are formed to improve the overall radiation efficiency of the antenna structure of the electronic package (or the antenna assembly) when the first antenna layers are electromagnetically coupled to the antenna feed lines and the second antenna layers. Therefore, compared with the prior art, the present disclosure improves the performance gain and efficiency of the antenna and strengthens the electric field intensity of the antenna so as to facilitate signal transmission, thereby meeting the requirement of antenna operation of a 5G system.

Further, through the design of the plurality of recesses with different depths, the present disclosure can adjust the electromagnetic coupling distances between the first antenna layers and the second antenna layers so as to generate different frequencies. As such, the antenna of the electronic package (or the antenna assembly) can transmit different antenna signals according to needs. Therefore, compared with the prior art, the single electronic package of the present disclosure can meet the requirements of RF products with multiple frequencies and replace multiple packaging modules with different frequencies. Hence, the product size can be reduced and the electronic package (or the antenna assembly) can meet the miniaturization requirement.

Furthermore, by stacking the antenna module on the first carrier structure, the present disclosure eliminates the need to increase the layout area on the first carrier structure. Therefore, antennas with various frequencies can be fabricated under a predetermined size of the first carrier structure, and hence the electronic package (or the antenna assembly) can meet the miniaturization requirement.

BRIEF DESCRIPTION OF THE DRAWINGS

FIGS. 3A, 3B, 3C-1, 3D and 3E are schematic cross-sectional views illustrating a method for fabricating an electronic package according to a second embodiment of the present disclosure.

FIG. 3C-2 is a schematic cross-sectional view showing another aspect of FIG. 3C-1.

DETAILED DESCRIPTION OF THE EMBODIMENTS

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2F are schematic cross-sectional views illustrating a method for fabricating an electronic package 2 according to a first embodiment of the present disclosure.

Figure 2A:
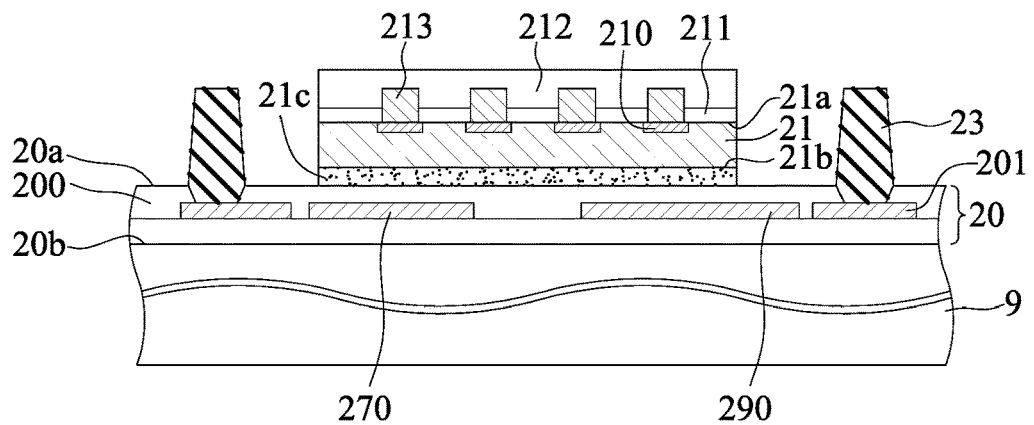
FIGS. 2A to 2F are schematic cross-sectional views illustrating a method for fabricating an electronic package according to a first embodiment of the present disclosure.

Referring to FIG. 2A, a first carrier structure 20 having opposite first and second sides 20a, 20b is provided and disposed on a carrier 9 via the second side 20b thereof. Then, a plurality of conductors 23 are formed on the first side 20a and electrically connected to the first carrier structure 20, and at least an electronic element 21 is disposed on the first side 20a of the first carrier structure 20.

In an embodiment, the first carrier structure 20 is a coreless circuit structure, which has at least a first insulating layer 200 and a first circuit layer 201 formed on the first insulating layer 200. For example, the first circuit layer 201 is a redistribution layer (RDL) having a first antenna feed line 270 and a second antenna feed line 290. As such, the first carrier structure 20 serves as an antenna substrate. For example, the first circuit layer 201 is made of copper, and the first insulating layer 200 is made of a dielectric material such as polybenzoxazole (PBO), polyimide (PI), prepreg (PP), etc.

Further, the carrier 9 is, for example, a circular plate made of a semiconductor material (e.g., silicon or glass) and the first insulating layer 200 of the first carrier structure 20 is mounted thereon.

Furthermore, each of the conductors 23 is, for example, a post-shaped body, a line-shaped body or a ball-shaped body, and disposed on and electrically connected the first circuit layer 201 (or the first antenna feed line 270 and the second antenna feed line 290). The conductor 23 can be made of a metal material such as copper or gold, or a solder material. It should be understood that the conductor 23 can be of various types. For example, the conductor 23 can be a passive element but is not limited to the above.

In addition, the electronic element 21 is an active element such as a semiconductor chip, a passive element such as a resistor, a capacitor or an inductor, or a combination thereof. In an embodiment, the electronic element 21 is a semiconductor chip having an active surface 21a with a plurality of electrode pads 210 and an inactive surfaces 21b opposite to the active surface 21a. The inactive surface 21b of the electronic element 21 is attached to the first side 20a of the first carrier structure 20 through a chip attachment layer 21c. A plurality of conductive bumps 213 are formed on the plurality of electrode pads 210 and at least a protective film is provided (in an embodiment, two protective films 211, 212 are provided) to cover the electrode pads 210 and the conductive bumps 213. The protective films 211, 212 can be made of such as PBO, nitride (e.g., silicon nitride), or oxide (e.g., silicon oxide). Each of the conductive bumps 213 can have a ball shape such as a conductive circuit or a solder ball, or have a post shape such as a copper post or a solder bump made from metal material, or have a stud shape formed through a wire bonder, but the present disclosure is not limited to as such. Further, the active surface 21a of the electronic element 21 can be flip-chip bonded and electrically connected to the first carrier structure 20 through the conductive bumps 213. It should be noted that the electronic element 21 can be electrically connected to the carrier structure in various manners such as in a wire bonding manner and not limited to the above-described manner.

Figure 2B:
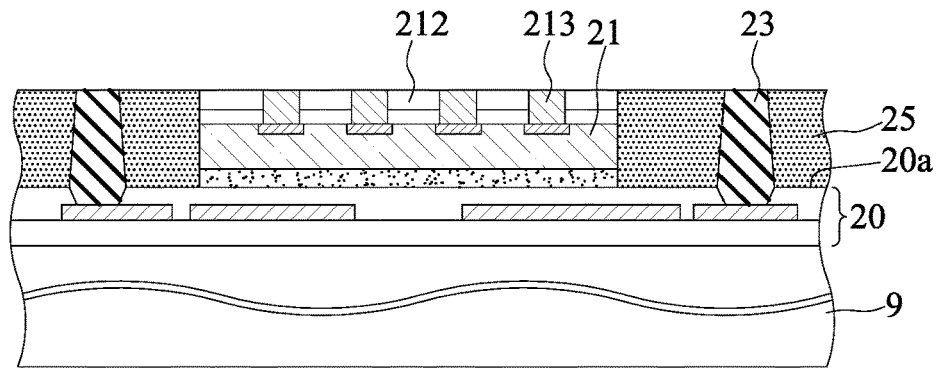

Referring to FIG. 2B, an encapsulant 25 is formed on the first side 20a of the first carrier structure 20 to encapsulate the electronic element 21 and the conductors 23. Then, a leveling process is performed such that the upper protective film 212, end surfaces of the conductors 23 and end surfaces of the conductive bumps 213 are exposed from the encapsulant 25 and flush with an upper surface of the encapsulant 25.

In an embodiment, the encapsulant 25 is made of an insulating material such as polyimide, a dry film, an epoxy resin or a molding compound, and formed on the first side 20a of the first carrier structure 20 by lamination or molding.

Further, the leveling process is performed by grinding so as to remove portions of the conductors 23, the protective film 212, the conductive bumps 213 and the encapsulant 25, thus allowing the upper surface of the encapsulant 25 to be flush with the protective film 212, the end surfaces of the conductors 23 and the end surfaces of the conductive bumps 213.

Figure 2C:
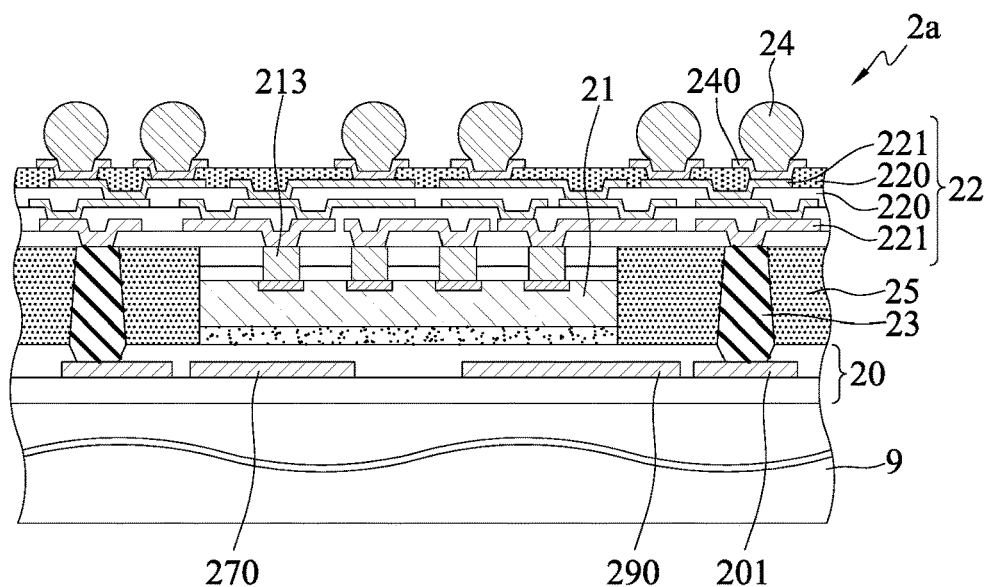

Referring to FIG. 2C, a second carrier structure 22 is formed on the encapsulant 25 and stacked on the first carrier structure 20, thus forming a packaging module 2a. Further, the second carrier structure 22 is electrically connected to the conductors 23 and the conductive bumps 213.

In an embodiment, the second carrier structure 22 is a coreless circuit structure, which has a plurality of second insulating layers 220, and a plurality of second circuit layers 221 such as RDLs formed on the second insulating layers 220. The outermost second insulating layer 220 serves as a solder mask and the outermost second circuit layer 221 is exposed from the solder mask. Alternatively, the second carrier structure 22 only has a single second insulating layer 220 and a single second circuit layer 221.

Further, the second circuit layer 221 is made of copper, and the second insulating layer 220 is made of a dielectric material such as PBO, PI or PP.

Furthermore, the first circuit layer 201 is electrically connected to the second circuit layer 221 through the conductors 23, thus electrically connecting the first antenna feed line 270 and the second antenna feed line 290 to the electronic element 21.

In addition, a plurality of conductive elements 24 such as solder balls are formed on the outermost second circuit layer 221. For example, a UBM (under bump metallurgy) layer 240 is formed on the outermost second circuit layer 221 so as to facilitate bonding of the conductive elements 24 with the second circuit layer 221.

Figure 2D:
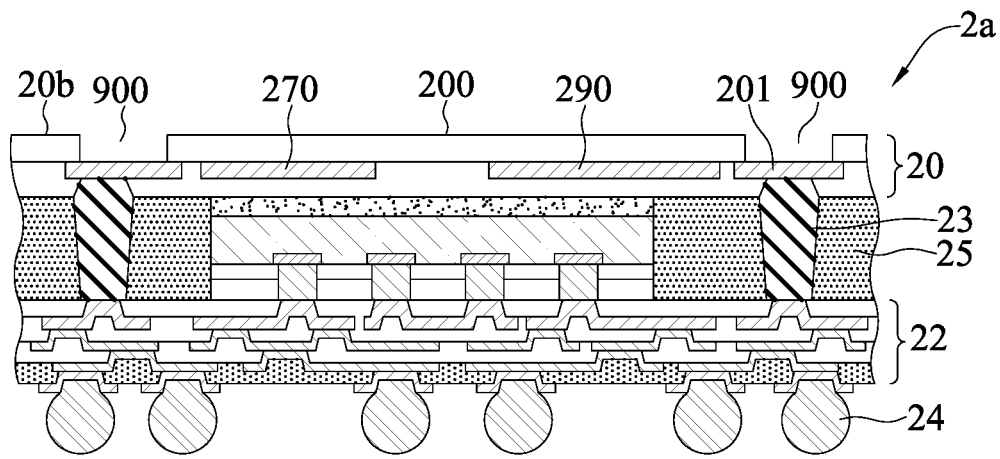

Referring to FIG. 2D, the carrier 9 is removed, the overall structure is flipped, and the outermost first insulating layer 200 serves as an insulating protective layer. Further, a plurality of openings 900 are formed on the outermost first insulating layer 200 for exposing portions of the first circuit layer 201.

In an embodiment, an insulating protective layer (not shown) such as a solder mask can further be formed on the second side 20b of the first carrier structure 20, and a plurality of openings can be formed in the insulating protective layer for exposing portions of the first circuit layer 201. Therefore, the packaging module 2a can be of various types and not limited to the above.

Figure 2E:
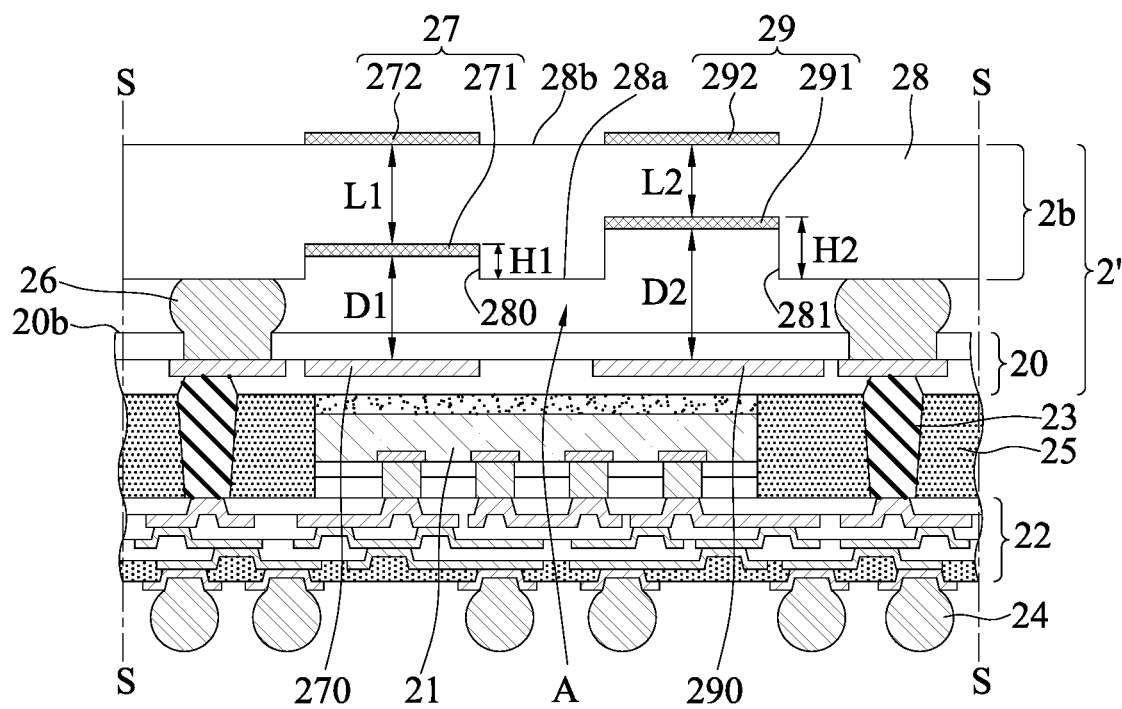

Referring to FIG. 2E, an antenna module 2b is stacked on the second side 20b of the first carrier structure 20 of the packaging module 2a through a plurality of support members 26, and an open area A is formed between the antenna module 2b and the first carrier structure 20.

In an embodiment, the antenna module 2b has a substrate body 28, which adopts a packaging substrate type, such as a packaging substrate having a core layer and a circuit structure, or a coreless circuit structure, and allows a plurality of antenna bodies 27, 29 to be formed with thin thickness on a dielectric material by sputtering, evaporation, electroplating, electroless plating, chemical plating or foiling. For example, the substrate body 28 is defined with opposite first and second surfaces 28a, 28b, and the first surface 28a of the substrate body 28 is disposed on the second side 20b of the first carrier structure 20 through the support members 26. The antenna bodies 27, 29 have first antenna layers 271, 291 and second antenna layers 272, 292 separated from one another and correspondingly arranged on the first and second surfaces 28a, 28b of the substrate body 28. The first antenna layers 271, 291 serve as inner antennas and the second antenna layers 272, 292 serve as outer antennas.

Further, the first antenna layers 271, 291 and the second antenna layers 272, 292 transmit signals in a coupling manner. For example, the first antenna layers 271, 291 and the second antenna layers 272, 292 can generate radiation energy by alternating voltage, alternating current or radiation variation, and the radiation energy is an electromagnetic field, which causes the first antenna layers 271, 291 and the second antenna layers 272, 292 to be electromagnetically coupled with one another, thus enabling antenna signals to be transmitted between the first antenna layers 271, 291 and the second antenna layers 272, 292. The first antenna layers 271, 291 are also electromagnetically coupled to the first antenna feed line 270 and the second antenna feed line 290 so as to enable antenna signals to be transmitted (e.g., sent or received) between the antenna bodies 27, 29 and the first circuit layer 201. Therefore, the antenna module 2b and the first carrier structure 20 constitute an antenna assembly 2', and the antenna bodies 27, 29, the first antenna feed line 270 and the second antenna feed line 290 can be regarded as an antenna structure.

Furthermore, the first surface 28a of the substrate body 28 has a plurality of recesses 280, 281 with different depths H1, H2. The recesses 280, 281 are arranged corresponding to the antenna bodies 27, 29, respectively, and the first antenna layers 271, 291 are formed on bottom surfaces of the recesses 280, 281, respectively. The greater the distances D1, D2 between the first antenna layers 271, 291 and the first and second antenna feed lines 270, 290, the wider the frequency bandwidth is, thereby facilitating adjustment of the radiation frequency. Therefore, compared with an antenna layer formed on the first surface 28a of the substrate body 28, the antenna layers formed in the recesses 280, 281 will increase the distances D1, D2 between the first antenna layers 271, 291 and the first and second antenna feed lines 270, 290. On the other hand, the shorter the distances L1, L2 between the first antenna layers 271, 291 and the second antenna layers 272, 292, the higher the frequency. As such, the depths H1, H2 of the recesses 280, 281 can be adjusted according to needs so as to adjust the distances L1, L2 between the first antenna layers 271, 291 and the second antenna layers 272, 292, thus obtaining required multiple frequencies.

In addition, the support members 26 have a post or wall shape. The support members 26 are bonded to the first circuit layer 201 in the openings 900, but not signal-connected to the first circuit layer 201. Therefore, the support members 26 are used for support and do not have a signal transmission function. For example, the support members 26 are made of an insulating material or a conductive material such as solder.

Figure 2F:
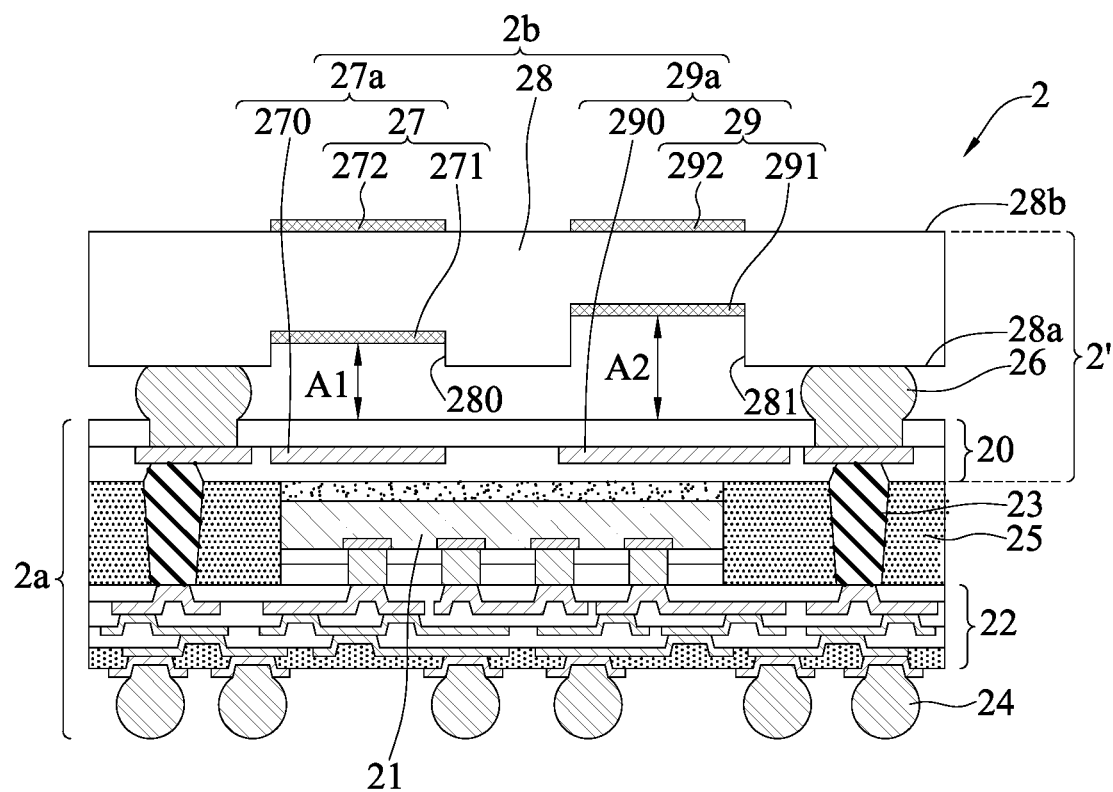

Referring to FIG. 2F, a singulation process is performed along a cutting path S of FIG. 2E so as to obtain the electronic package 2.

In an embodiment, the electronic package 2 can be mounted to an electronic device such as a circuit board (not shown) through the conductive elements 24, and the antenna module 2b can receive/transmit antenna signals from/to the electronic element 21 through the conductors 23 and the second carrier structure 22 by using the first antenna feed line 270 and the second antenna feed line 290.

In an embodiment, a low dielectric constant structure that includes air gaps A1, A2 (composed of the open area A and the recesses 280, 281) is adopted as a signal transmission medium between the first antenna layers 271, 291 and the first and second antenna feed lines 270, 290 so as to improve the overall radiation efficiency of the antenna structure of the electronic package 2 (or the antenna assembly 2').

Further, through the design of the recesses 280, 281, the heights of the air gaps A1, A2 can be adjusted, i.e., the electromagnetic coupling distances L1, L2 between the first antenna layers 271, 291 and the second antenna layers 272, 292 can be adjusted, thereby generating 5G millimeter waves with different frequencies. As such, the antenna structure of the electronic package 2 (or the antenna assembly 2') can transmit different antenna signals according to needs. For example, a low frequency antenna portion 27a is formed between the first antenna feed line 270, the first antenna layer 271 and the second antenna layer 272, and a high frequency antenna portion 29a is formed between the second antenna feed line 290, the first antenna layer 291 and the second antenna layer 292. The electronic element 21 receives/transmits 5G millimeter wave signals with a frequency of 28 GHz through the low frequency antenna portion 27a or receives/transmits 5G millimeter wave signals with a frequency of 60 GHz through the high frequency antenna portion 29a.

Therefore, compared with the prior art, through the design of the antenna module 2b containing antenna portions with multiple frequencies (the low frequency antenna portion 27a and the high frequency antenna portion 29a), the single electronic package 2 of the present disclosure can meet the requirements of radio-frequency (RF) products with multiple frequencies and replace multiple packaging modules 2a with different frequencies. Hence, the product size can be reduced and the electronic package 2 (or the antenna assembly 2') can meet the miniaturization requirement.

Further, by stacking the antenna module 2b on the first carrier structure 20, the present disclosure eliminates the need to increase the layout area on the first carrier structure 20. Therefore, the method according to the present disclosure can fabricate antennas with various frequencies (i.e., millimeter wave antennas) under a predetermined size of the first carrier structure 20. As such, the electronic package 2 (or the antenna assembly 2') can meet the miniaturization requirement.

FIGS. 3A to 3E are schematic cross-sectional views illustrating a method for fabricating an electronic package 3 according to a second embodiment of the present disclosure. The second embodiment is similar to the first embodiment and the differences therebetween are described as follows.

Figure 3A:
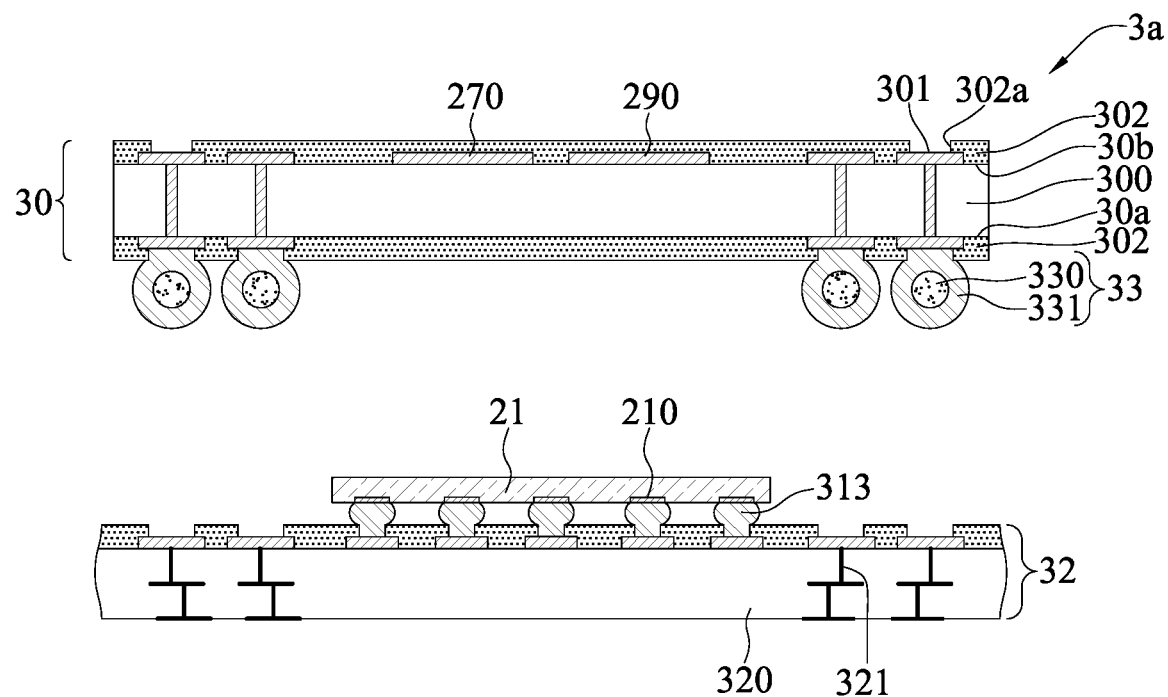

Referring to FIG. 3A, a first carrier structure 30 having a plurality of conductors 33 mounted thereon and a second carrier structure 32 having an electronic element 21 disposed thereon are provided.

The first carrier structure 30 has opposite first and second sides 30a, 30b, and an insulating protective layer 302 such as a solder mask is formed on the first and second sides 30a, 30b. In an embodiment, the first carrier structure 30 is a packaging substrate containing a circuit structure having a core layer or a coreless circuit structure. The circuit structure contains such as an insulator 300 made of a dielectric material and a first circuit layer 301 such as a fan-out type redistribution layer (RDL) formed on the insulator 300. The first circuit layer 301 has a first antenna feed line 270 and a second antenna feed line 290, and the first carrier structure 30 can be regarded as an antenna substrate. The dielectric material is, for example, prepreg (PP), polyimide (PI), epoxy resin or glass fiber, and the first circuit layer 301 is made of metal such as copper. It should be understood that the first carrier structure 30 can also be other carrier for carrying chips, such as an organic board, a wafer, or a carrier having metal routing. Further, since the first carrier structure 30 is a plate, the carrier 9 of FIG. 2A can be dispensed with.

Further, a plurality of openings 302a are formed in the insulating protective layer 302 for exposing portions of the first circuit layer 301.

The second carrier structure 32 is a packaging substrate containing a circuit structure having a core layer or a coreless circuit structure. The circuit structure contains such as an insulator 320 made of a dielectric material and a second circuit layer 321 such as a fan-out type redistribution layer (RDL) formed on the insulator 320. The dielectric material is, for example, prepreg (PP), polyimide (PI), epoxy resin or glass fiber, and the second circuit layer 321 is made of metal such as copper. It should be understood that the second carrier structure 32 can also be other carrier for carrying chips, such as an organic board, a wafer, or a carrier having metal routing.

The electronic element 21 is flip-chip disposed on the second carrier structure 32, and electrode pads 210 of the electronic element 21 are electrically connected to the second carrier structure 32 through a plurality of conductive bumps 313 made of such as a solder material.

The conductors 33 are formed on the first side 30a of the first carrier structure 30. In an embodiment, the conductors 33 can be made of various materials. Each of the conductors 33 has a core 330 and a conductive material 331 encapsulating the core 330. Therein, the core 330 is made of an insulating material such as a plastic ball or a metal material such as a copper ball, and the conductive material 331 is a solder material such as nickel tin (Ni—Sn), tin lead (Sn—

Pb) or tin silver (Sn—Ag). It should be understood that the conductor 33 can also be a passive element or made of a single material, as shown in FIG. 2A.

Figure 3B:
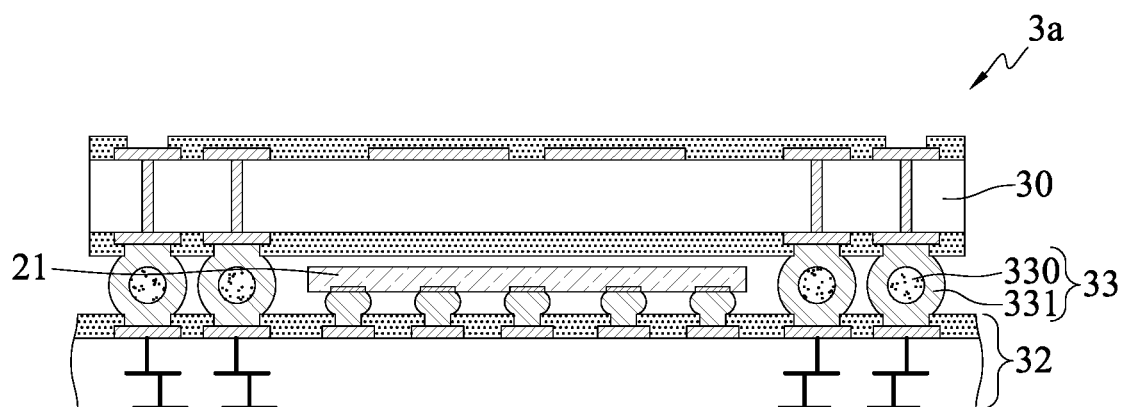

Referring to FIG. 3B, the first carrier structure 30 is stacked on the second carrier structure 32 through the conductors 33 and the conductive material 331 is reflowed. As such, the first carrier structure 30 is securely fastened to the second carrier structure 32, thus forming a packaging module 3a. The electronic element 21 is positioned between the first carrier structure 30 and the second carrier structure 32.

In an embodiment, the first carrier structure 30 is electrically connected to the second carrier structure 32 through the conductors 33.

Figure 1:
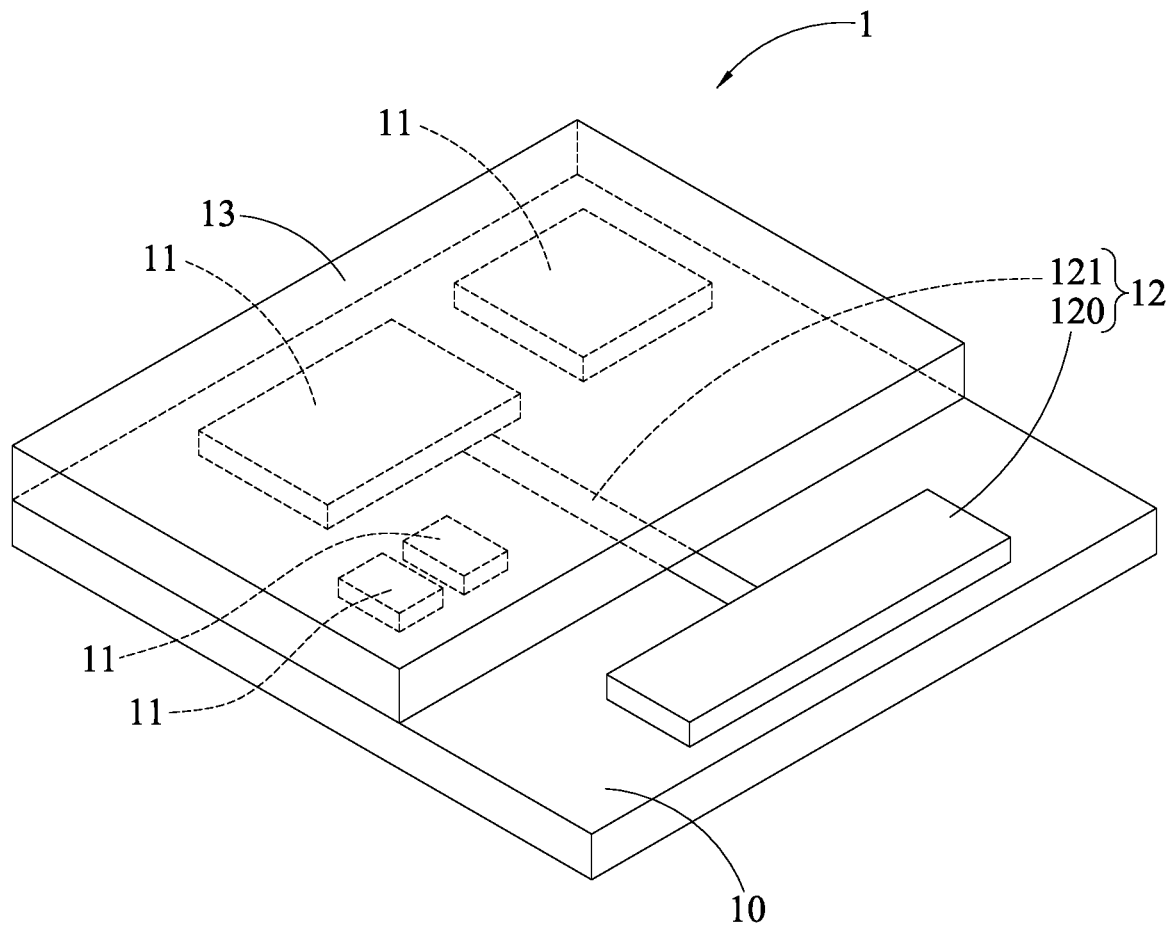
FIG. 1 is a schematic cross-sectional view of a conventional wireless communication module.
Figures 1, 3C:
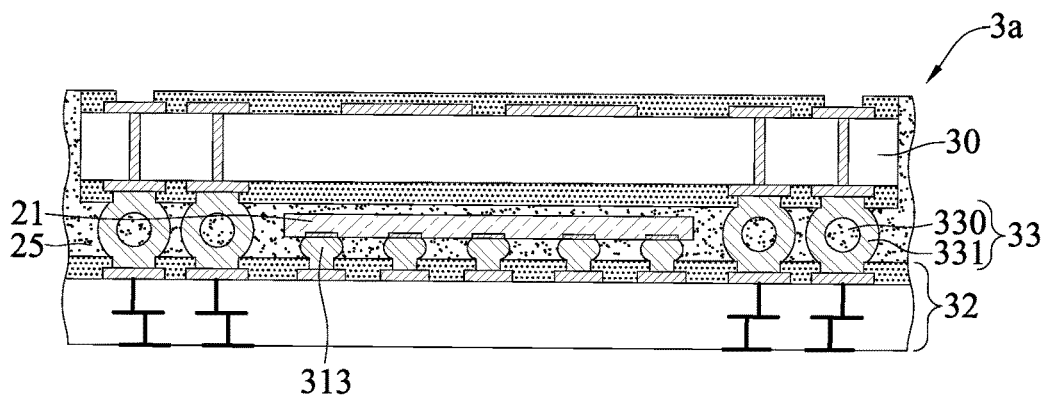

Referring to FIG. 3C-1, an encapsulant 25 is formed between the first carrier structure 30 and the second carrier structure 32 to encapsulate the conductors 33, the conductive bumps 313 and the electronic element 21.

Figures 2, 3C:
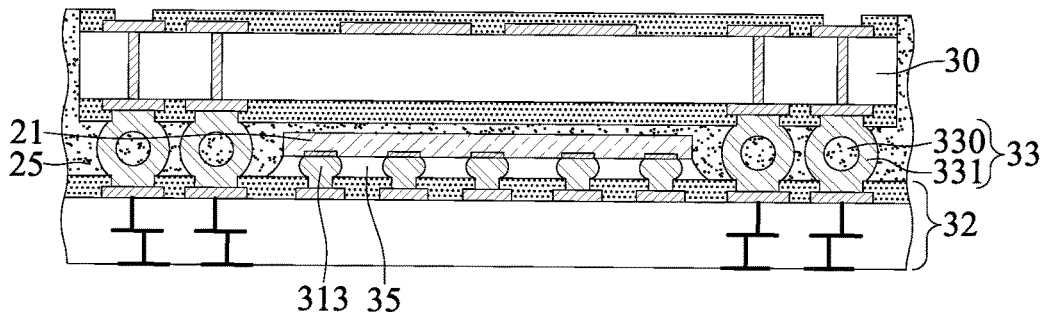

In an embodiment, referring to FIG. 3C-2, an underfill 35 can be formed between the second carrier structure 32 and the electronic element 21 to encapsulate the conductive bumps 313, and then the encapsulant 25 is formed to encapsulate the conductors 33, the underfill 35 and the electronic element 21.

Figure 3D:
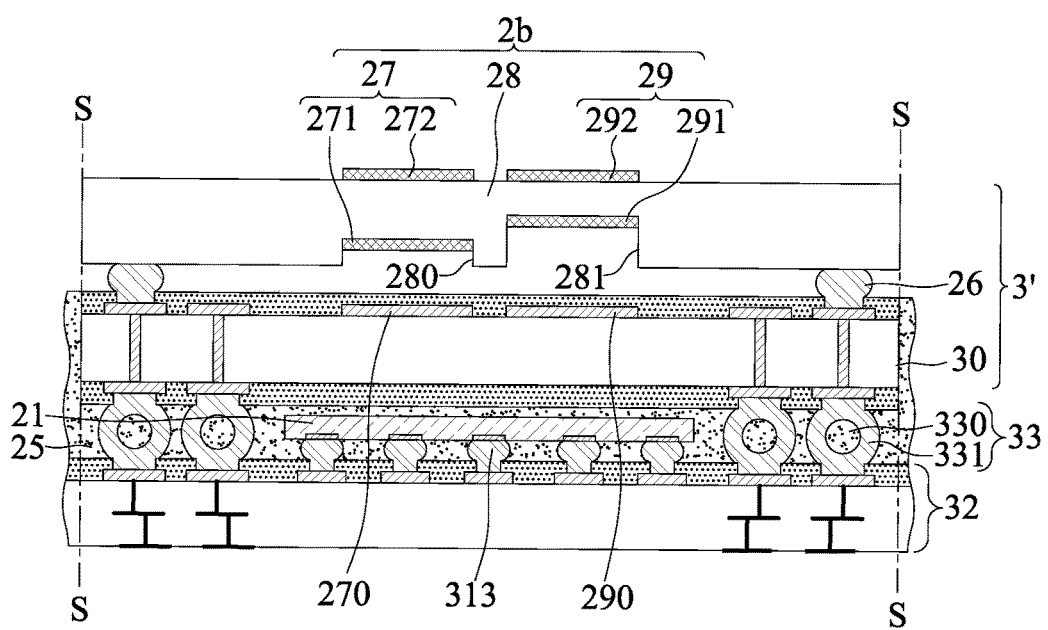

Referring to FIG. 3D, continued from the process of FIG. 3C-1, an antenna module 2b is stacked on the first carrier structure 30 through a plurality of support members 26, and the first antenna layers 271, 291 correspond in position to the first antenna feed line 270 and the second antenna feed line 290, respectively, thus enabling antenna signals to be transmitted between the antenna bodies 27, 29 and the first circuit layer 301. Therein, the antenna module 2b and the first carrier structure 30 can be regarded as an antenna assembly 3', and the first antenna feed line 270, the second antenna feed line 290, the first antenna layers 271, 291 and the second antenna layers 272, 292 can be regarded as an antenna structure.

In an embodiment, the support members 26 are bonded to the first circuit layer 301 in the openings 302a, but not signal-connected to the first circuit layer 301. Therefore, the support members 26 are used for support and do not have a signal transmission function.

Figure 3E:
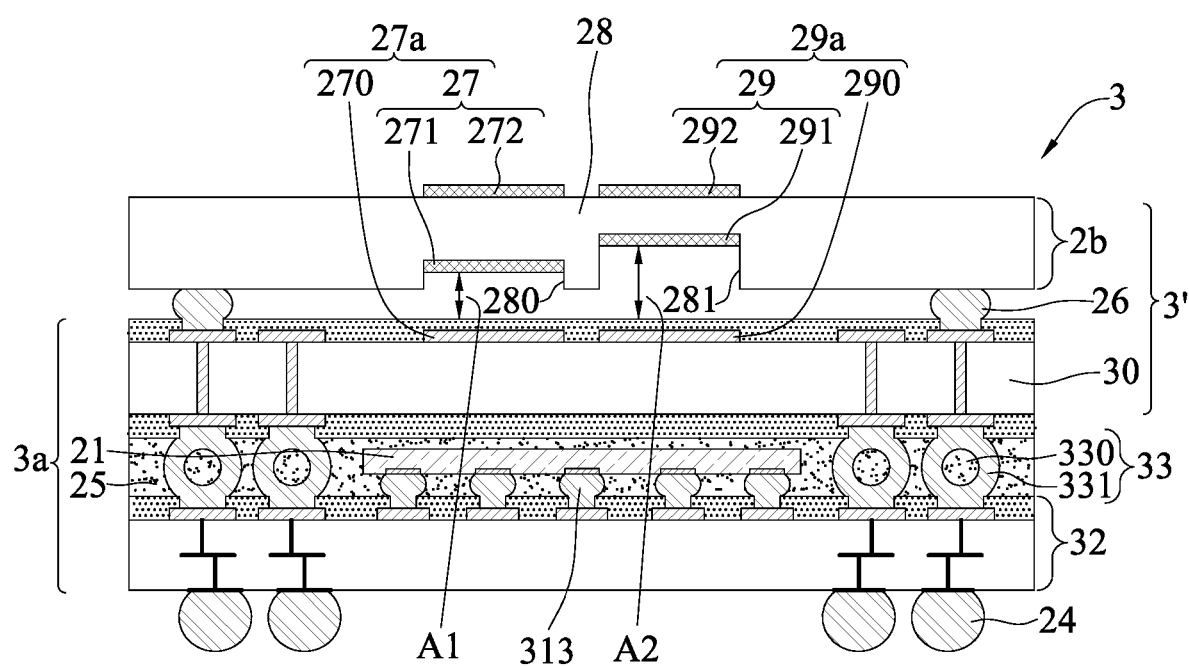

Referring to FIG. 3E, a plurality of conductive elements 24 such as solder balls are formed on the second carrier structure 32, and a singulation process is performed along a cutting path S of FIG. 3D so as to obtain the electronic package 3.

In an embodiment, air gaps A1, A2 are adopted as a signal transmission medium between the first antenna layers 271, 291 and the first and second antenna feed lines 270, 290 so as to improve the overall radiation efficiency of the antenna assembly 3' of the electronic package 3.

Further, through the design of the recesses 280, 281, the heights of the air gaps A1, A2 can be adjusted, i.e., the electromagnetic coupling distances L1, L2 between the first antenna layers 271, 291 and the second antenna layers 272, 292 can be adjusted, thereby generating 5G millimeter waves with different frequencies. As such, the antenna structure of the electronic package 3 (or the antenna assembly 3') can transmit different antenna signals according to needs. Therefore, compared with the prior art, through the design of the antenna module 2b containing antenna portions with multiple frequencies (the low frequency antenna portion 27a and the high frequency antenna portion 29a), the single electronic package 3 can meet the requirements of RF products with multiple frequencies and replace multiple packaging modules 3a with different frequencies. Hence, the product size can be reduced and the electronic package 3 (or the antenna assembly 3') can meet the miniaturization requirement.

Further, by stacking the antenna module 2b on the first carrier structure 30, the present disclosure eliminates the need to increase the layout area on the first carrier structure 30. Therefore, the method according to the present disclosure can fabricate antennas with various frequencies (i.e., millimeter wave antennas) under a predetermined size of the first carrier structure 30. As such, the electronic package 3 (or the antenna assembly 3') can meet the miniaturization requirement.

Figure 4A:
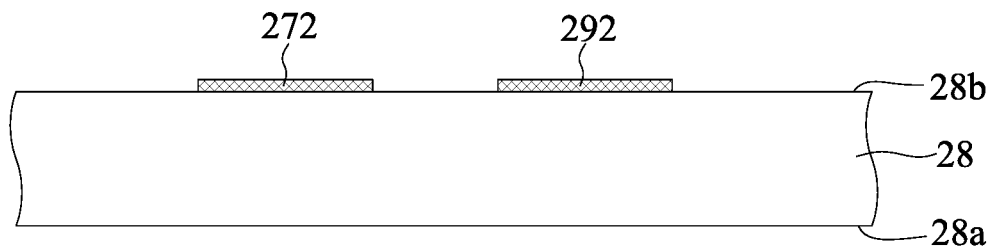
FIGS. 4A to 4C are schematic cross-sectional views illustrating a method for fabricating an antenna module of an electronic package according to the present disclosure.
Figure 4B:
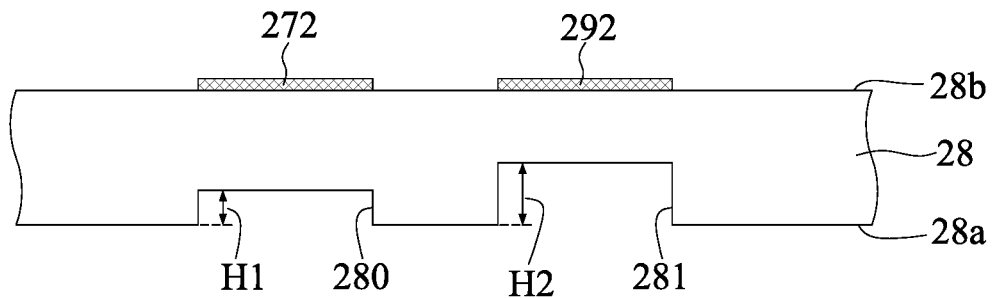
Figure 4C:
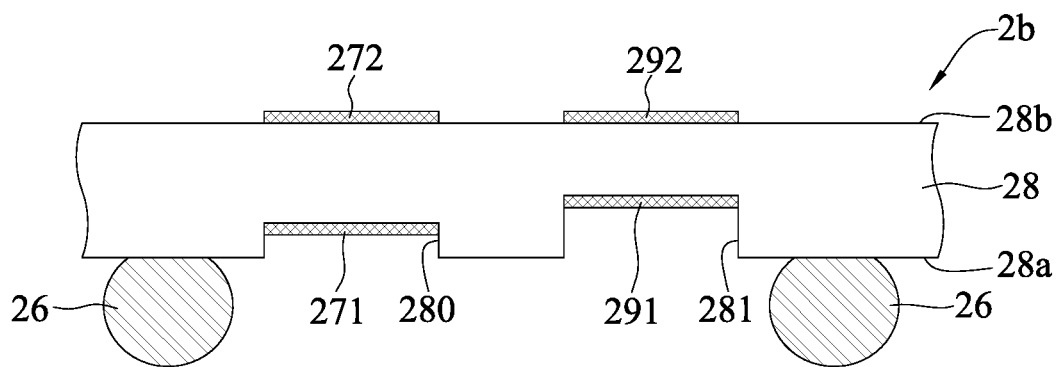

FIGS. 4A to 4C are schematic cross-sectional views illustrating a method for fabricating the antenna module 2b according to the present disclosure.

Referring to FIG. 4A, a substrate body 28 having opposite first and second surfaces 28a, 28b is provided, and second antenna layers 272, 292 are formed on the second surface 28b of the substrate body 28 by metal electroplating so as to serve as outer antennas.

Referring to FIG. 4B, recesses 280, 281 with different depths H1, H2 are formed on the first surface 28a of the substrate body 28 by such as etching.

Referring to FIG. 4C, first antenna layers 271, 291 are formed on bottom surfaces of the recesses 280, 281 by metal electroplating, respectively, so as to serve as inner antennas, and a plurality of support members 26 are formed on a peripheral region of the first surface 28a of the substrate body 28.

It should be understood that the methods for forming the antenna layers and the recesses 280, 281 can be varied and not limited to the above. For example, the recesses 280, 281 can be formed before formation of the second antenna layers 272, 292.

The present disclosure further provides an electronic package 2, 3, which has: a first carrier structure 20, 30 having a first antenna feed line 270 and a second antenna feed line 290; and an antenna module 2b.

The antenna module 2b is disposed on the first carrier structure 20, 30 and comprises a substrate body 28 having opposite first and second surfaces 28a, 28b. The substrate body 28 is disposed on the first carrier structure 20, 30 via the first surface 28a thereof, the first surface 28a of the substrate body 28 has a plurality of recesses 280, 281 with different depths H1, H2, and first antenna layers 271, 291 are formed in the plurality of recesses 280, 290, respectively, and the second surface 28b of the substrate body 28 has second antenna layers 272, 292 corresponding in configuration to the first antenna layers 271, 291. The first antenna layers 271, 291 are electromagnetically coupled to the first and second antenna feed lines 270, 290 and the second antenna layers 272, 292.

In an embodiment, air gaps A1, A2 are formed between the first antenna layers 271, 291 and the first and second antenna feed lines 270, 290.

In an embodiment, the antenna module 2b is disposed on the first carrier structure 20, 30 through a plurality of support members 26.

In an embodiment, the electronic package 2, 3 further has: a second carrier structure 22, 32 and at least an electronic element 21. The first carrier structure 20, 30 has a first side 20a, 30a and a second side 20b, 30b opposite to the first side 20a, 30a, and the antenna module 2b is disposed on the second side 20b, 30b of the first carrier structure 20, 30.

The second carrier structure 22, 32 is stacked on the first side 20a, 30a of the first carrier structure 20, 30 through a plurality of conductors 23, 33.

The electronic element 21 is disposed between the first carrier structure 20, 30 and the second carrier structure 22, 32 and electrically connected to the conductors 23, 33.

In an embodiment, the first carrier structure 20, 30 is electrically connected to the second carrier structure 22, 32 through the conductors 23, 33.

In an embodiment, the first antenna feed line 270 and the second antenna feed line 290 are electrically connected to the conductors 23, 33 so as to be electrically conductive to the electronic element 21.

In an embodiment, the electronic package 2, 3 further has an encapsulant 25 formed between the first carrier structure 20, 30 and the second carrier structure 22, 32 for encapsulating the electronic element 21.

In an embodiment, the electronic package 2, 3 further has a plurality of conductive elements 24 formed on the second carrier structure 22, 32. The conductive elements 24 and the conductors 23, 33 are positioned at different sides of the second carrier structure 22, 32.

According to the present disclosure, air gaps are adopted as a signal transmission medium between the first antenna layers and the antenna feed lines so as to improve the overall radiation efficiency of the antenna structure of the electronic package (or the antenna assembly).

Further, by designing a plurality of recesses with different depths, the electromagnetic coupling distances between the first antenna layers and the second antenna layers can be adjusted so as to generate different frequencies. As such, the antenna of the electronic package (or the antenna assembly) can transmit different antenna signals according to needs. Therefore, a single electronic package of the present disclosure can meet the requirements of RF products with multiple frequencies and replace multiple packaging modules with different frequencies. Hence, the product size can be reduced and the electronic package (or the antenna assembly) can meet the miniaturization requirement.

Furthermore, by stacking the antenna module on the first carrier structure, the present disclosure eliminates the need to increase the layout area on the first carrier structure. Therefore, the present disclosure can fabricate antennas with various frequencies under a predetermined size of the first carrier structure. As such, the electronic package (or the antenna assembly) can meet the miniaturization requirement.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended

What is claimed is:

1. An electronic package, comprising:
   a first carrier structure having a plurality of antenna feed lines; and
   an antenna module disposed on the first carrier structure and comprising a substrate body having opposite first and second surfaces, the substrate body being disposed on the first carrier structure via the first surface thereof, wherein the first surface of the substrate body has a plurality of recesses with different depths and first antenna layers are formed in the plurality of recesses, and the second surface of the substrate body has second antenna layers corresponding in configuration to the first antenna layers, and wherein the first antenna layers are electromagnetically coupled to the antenna feed lines and the second antenna layers.

2. The electronic package of claim 1, further comprising an air gap formed between the first antenna layers and the antenna feed lines.

3. The electronic package of claim 1, wherein the antenna module is disposed on the first carrier structure through support members.

4. The electronic package of claim 1, wherein the first carrier structure has two opposite sides, and the antenna module is disposed on one of the sides of the first carrier structure, the electronic package further comprising:
   a second carrier structure stacked on the other side of the first carrier structure through a plurality of conductors; and
   at least one electronic element disposed between the first carrier structure and the second carrier structure and electrically connected to the conductors.

5. The electronic package of claim 4, wherein the first carrier structure is electrically connected to the second carrier structure through the conductors.

6. The electronic package of claim 4, wherein the antenna feed lines are electrically connected to the conductors to electrically conduct the electronic element.

7. The electronic package of claim 4, further comprising an encapsulant formed between the first carrier structure and the second carrier structure and encapsulating the electronic element.

8. The electronic package of claim 4, further comprising a plurality of conductive elements formed on the second carrier structure, wherein the conductive elements and the conductors are positioned at different sides of the second carrier structure.

9. A method for fabricating an electronic package, comprising:
   providing a substrate body having a first surface and a second surface opposite to the first surface, wherein the second surface has second antenna layers thereon;
   forming a plurality of recesses with different depths on the first surface of the substrate body;
   forming first antenna layers in the plurality of recesses, wherein the first antenna layers are electromagnetically coupled to the second antenna layers; and
   disposing the substrate body on a first carrier structure having a plurality of antenna feed lines via the first surface thereof, wherein the first antenna layers are electromagnetically coupled to the antenna feed lines.

10. The method of claim 9, further comprising forming an air gap between the first antenna layers and the antenna feed lines.

11. The method of claim 9, wherein the substrate body is disposed on the first carrier structure through support members.

12. The method of claim 9, wherein the plurality of recesses are formed on the first surface of the substrate body by etching.

13. The method of claim 9, wherein the first carrier structure has two opposite sides, and the substrate body is disposed on one of the sides of the first carrier structure, the method further comprising:
   stacking a second carrier structure on the other side of the first carrier structure through a plurality of conductors; and
   disposing at least one electronic element between the first carrier structure and the second carrier structure to electrically connect the conductors.

14. The method of claim 13, wherein the first carrier structure is electrically connected to the second carrier structure through the conductors.

15. The method of claim 13, wherein the antenna feed lines are electrically connected to the conductors to electrically conduct the electronic element.

16. The method of claim 13, further comprising forming an encapsulant between the first carrier structure and the second carrier structure for encapsulating the electronic element.

17. The method of claim 13, further comprising disposing a plurality of conductive elements on the second carrier structure, wherein the conductive elements and the conductors are positioned at different sides of the second carrier structure.

* * * * *